United States Patent
Wei et al.

(10) Patent No.: US 9,899,268 B2
(45) Date of Patent: Feb. 20, 2018

(54) CAP LAYER FOR SPACER-CONSTRAINED EPITAXIALLY GROWN MATERIAL ON FINS OF A FINFET DEVICE

(71) Applicant: GLOBALFOUNDRIES Inc., Grand Cayman (KY)

(72) Inventors: Andy C. Wei, Queensbury, NY (US); Guillaume Bouche, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 25 days.

(21) Appl. No.: 14/644,269

(22) Filed: Mar. 11, 2015

(65) Prior Publication Data
US 2016/0268171 A1   Sep. 15, 2016

(51) Int. Cl.
H01L 21/8238 (2006.01)
H01L 29/10 (2006.01)
H01L 27/092 (2006.01)
H01L 29/78 (2006.01)

(52) U.S. Cl.
CPC ........ *H01L 21/823807* (2013.01); *H01L 21/823821* (2013.01); *H01L 21/823864* (2013.01); *H01L 27/0924* (2013.01); *H01L 29/1054* (2013.01); *H01L 29/7851* (2013.01)

(58) Field of Classification Search
CPC ..... H01L 21/823807; H01L 21/823821; H01L 21/823864; H01L 21/823871
See application file for complete search history.

(56) References Cited

U.S. PATENT DOCUMENTS

| 8,481,410 | B1 | 7/2013 | LiCausi |
| 9,059,043 | B1 | 6/2015 | Leobandung |
| 9,076,689 | B2 | 7/2015 | Yu |
| 2004/0262687 | A1 | 12/2004 | Jung et al. |
| 2008/0079094 | A1 | 4/2008 | Jin |
| 2008/0265321 | A1 | 10/2008 | Yu |
| 2009/0035909 | A1 | 2/2009 | Chang |
| 2011/0147842 | A1 | 6/2011 | Cappellani |
| 2011/0214781 | A1 | 9/2011 | Horppu |
| 2011/0309333 | A1 | 12/2011 | Cheng |
| 2012/0074464 | A1 | 3/2012 | Cea |
| 2012/0126375 | A1 | 5/2012 | Wang |

(Continued)

OTHER PUBLICATIONS

Office Action from related U.S. Appl. No. 14/308,003, dated Sep. 15, 2015.

(Continued)

*Primary Examiner* — Su C Kim
*Assistant Examiner* — David S Wilbert
(74) *Attorney, Agent, or Firm* — Amerson Law Firm, PLLC

(57) ABSTRACT

A method includes forming at least one fin in a semiconductor substrate. A fin spacer is formed on at least a first portion of the at least one fin. The fin spacer has an upper surface. The at least one fin is recessed to thereby define a recessed fin with a recessed upper surface that it is at a level below the upper surface of the fin spacer. A first epitaxial material is formed on the recessed fin. A lateral extension of the first epitaxial material is constrained by the fin spacer. A cap layer is formed on the first epitaxial material. The fin spacer is removed. The cap layer protects the first epitaxial material during the removal of the fin spacer.

19 Claims, 9 Drawing Sheets

(56) References Cited

U.S. PATENT DOCUMENTS

| | | |
|---|---|---|
| 2013/0122676 A1 | 5/2013 | Jeng |
| 2013/0187206 A1 | 7/2013 | Mor |
| 2013/0341638 A1 | 12/2013 | Liao |
| 2014/0001520 A1 | 1/2014 | Glass |
| 2014/0273397 A1 | 9/2014 | Rodder et al. |
| 2014/0273429 A1 | 9/2014 | Wei |
| 2014/0308781 A1 | 10/2014 | Basker |
| 2014/0357040 A1 | 12/2014 | Loubet |
| 2015/0214059 A1 | 7/2015 | Bouche |
| 2015/0214331 A1 | 7/2015 | Jang |
| 2015/0214366 A1 | 7/2015 | Chang |
| 2015/0221676 A1* | 8/2015 | Holt ................ H01L 29/66795 257/347 |
| 2015/0236123 A1 | 8/2015 | Chang |
| 2015/0243659 A1 | 8/2015 | Huang |
| 2015/0380553 A1* | 12/2015 | Park .................. H01L 29/7848 257/190 |

OTHER PUBLICATIONS

Taiwanese Examination Report dated Apr. 11, 2017, for Taiwanese patent application No. 104140287, filed on Dec. 2, 2015.

* cited by examiner

CAP LAYER FOR SPACER-CONSTRAINED EPITAXIALLY GROWN MATERIAL ON FINS OF A FINFET DEVICE

BACKGROUND OF THE INVENTION

1. Field of the Invention

The present disclosure generally relates to the fabrication of semiconductor devices, and, more particularly, to a method for using spacers to constrain epitaxial growth on fins of a finFET device and for providing a cap layer to protect the epitaxial material during removal of the spacers.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fin is vertically spaced apart from and above the substrate with an isolation material positioned between the fin and the substrate. FIG. 1A is a perspective view of an illustrative prior art FinFET semiconductor device 100 that is formed above a semiconductor substrate 105 at an intermediate point during fabrication. In this example, the Fin-FET device 100 includes three illustrative fins 110, an isolation material 130, a gate structure 115, sidewall spacers 120 and a gate cap layer 125. The gate structure 115 is typically comprised of a layer of insulating material (not separately shown), e.g., a layer of high-k insulating material or silicon dioxide, and one or more conductive material layers (e.g., metal and/or polysilicon) that serve as the gate electrode for the device 100. The fins 110 have a three-dimensional configuration: a height, a width, and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition. Forming the additional epi material on the fins 110 in the source/drain regions of the device reduces the resistance of source/drain regions and/or makes it easier to establish electrical contact to the source/drain regions.

FIG. 1B illustrates a cross-sectional view depicting the formation of epitaxial semiconductor material on various fins across the substrate 105, including fins for various finFET devices 100. The epitaxial material is formed in the source/drain regions of the finFET devices. The fins 110 shown in FIG. 1B are so-called densely-spaced fins. Additional so-called isolated fins 135 are illustrated representing a different region of the substrate 105 where the spacing between adjacent fins is larger. For example, the densely-spaced fins 110 may be part of a logic device or SRAM NFET, while the isolated fins 135 may be part of an SRAM PFET. During an epitaxial material growth process, the growth starts in the direction of a (111) crystallographic plane of the substrate 105. In the case of the densely spaced fins 110, the epitaxial material can grow between the fins 110 and merge to form a substantially horizontal surface. Further growth from the horizontal surface occurs in a direction corresponding to a (100) plane of the substrate. Growth occurs much faster in a (100) plane as compared to a (111) plane, thus resulting in a merged epitaxial material structure 140 above the densely-spaced fins 110 and discrete unmerged epitaxial material structures 145 above the isolated fins 135.

A device with the merged epitaxial material structure 140 can have different device characteristics as compared to a device with the discrete unmerged epitaxial material structures 145. For example, the resistance of the device may be higher for the device with the merged epitaxial material structure 140. Conductive contact structures will eventually be formed to the source/drain regions of the device. Due to the relatively higher position of the upper surface and the more planar-like surface topology of the merged epitaxial material structure 140, the contact etches terminate differently, and the contact structures have different sizes, as compared to contact structures formed on the discrete unmerged epitaxial material structures 145 above the isolated fins 135. This size difference results in a difference in resistance. In addition, the densely-spaced fins 110 may be associated with separate devices (e.g., an N-channel device and a P-channel device), and the merged epitaxial material structure 140 may cause a short circuit between the densely-spaced fins 110 of the separate devices, which may destroy their functionality.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes, among other things, forming at least one fin in a semiconductor substrate. A fin spacer is formed on at least a first portion of the at least one fin. The fin spacer has an upper surface. The at least one fin is recessed to thereby define a recessed fin with a recessed upper surface that it is at a level below the upper surface of the fin spacer. A first epitaxial material is formed on the recessed fin. A lateral extension of the first epitaxial material is constrained by the fin spacer. A cap layer is formed on the first epitaxial material. The fin spacer is removed. The cap layer protects the first epitaxial material during the removal of the fin spacer.

One illustrative fin field effect transistor includes, among other things, at least one fin, first epitaxial material disposed on a tip portion of the at least one fin, and a first conductive cap layer disposed on a top portion of the first epitaxial material without covering sidewalls of the first epitaxial material.

BRIEF DESCRIPTION OF THE DRAWINGS

The disclosure may be understood by reference to the following description taken in conjunction with the accompanying drawings, in which like reference numerals identify like elements, and in which.

Figure 1A:
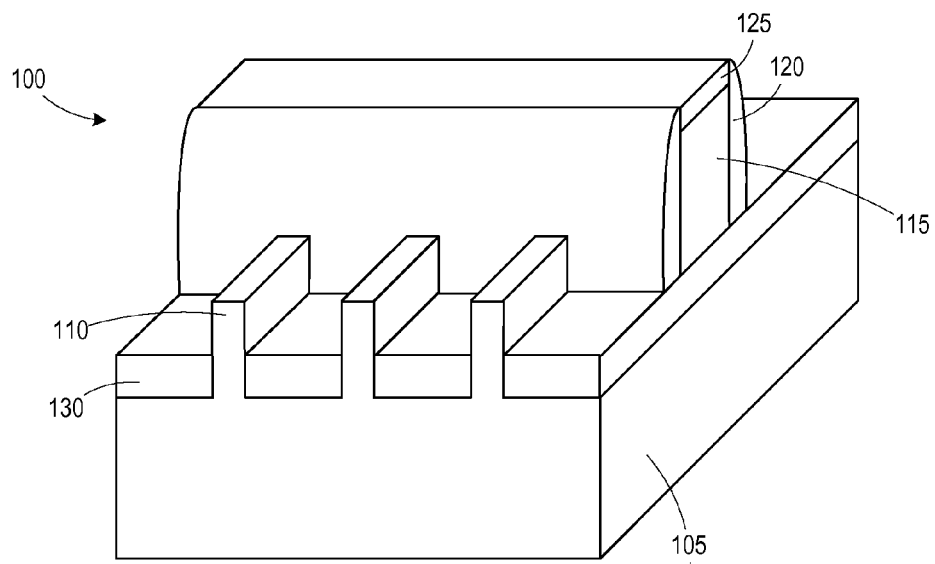
FIGS. 1A-1B schematically depict an illustrative prior art finFET device.
Figure 1B:
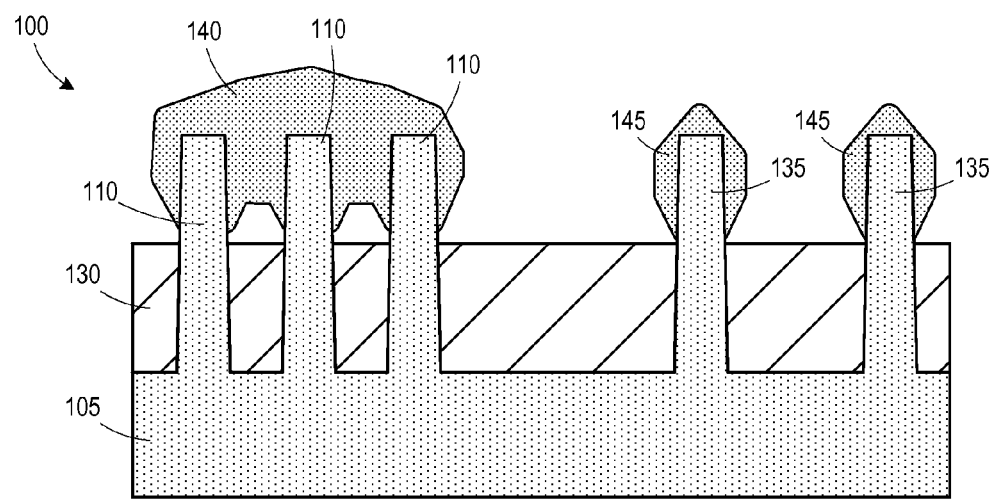

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a finFET device with raised epitaxial source/drain regions without causing merging of the epitaxial material above densely-spaced fins and the resulting semiconductor devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
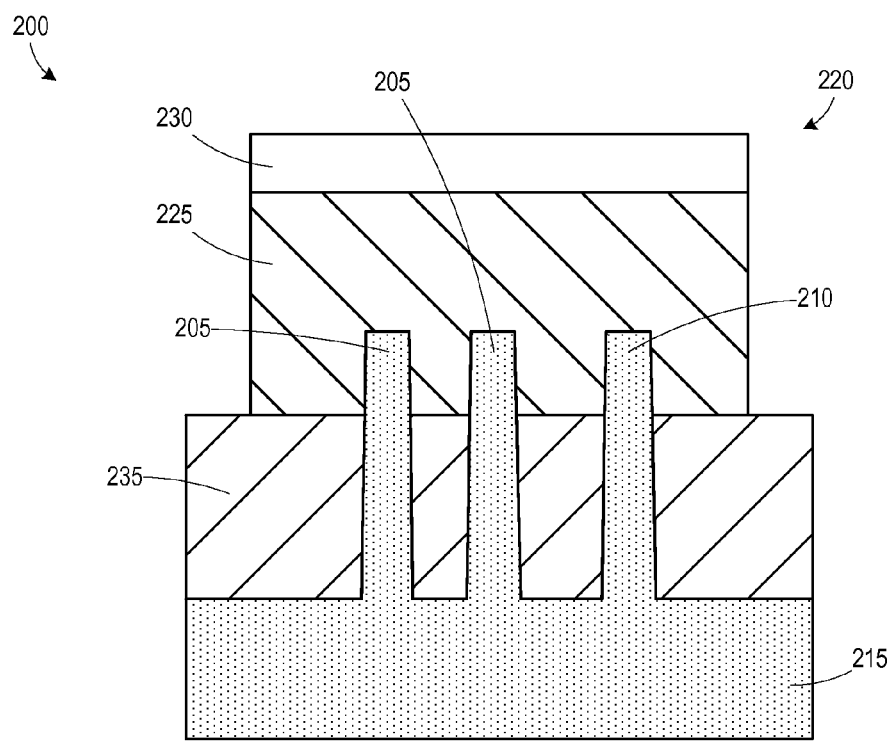
FIGS. 2A-2P depict various methods disclosed herein of forming a finFET device.
Figure 2B:
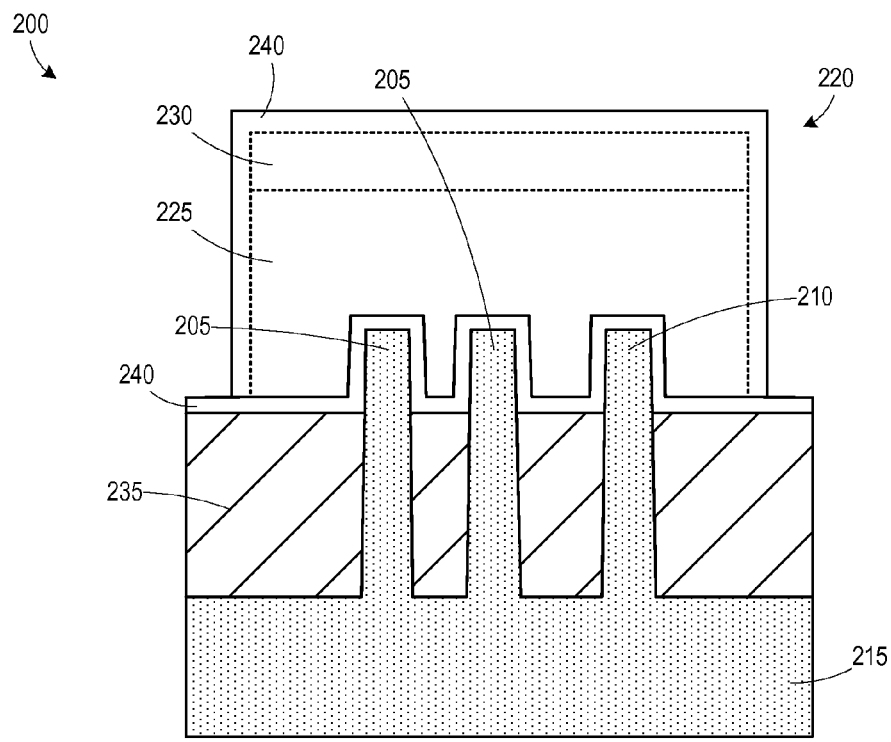
Figure 2C:
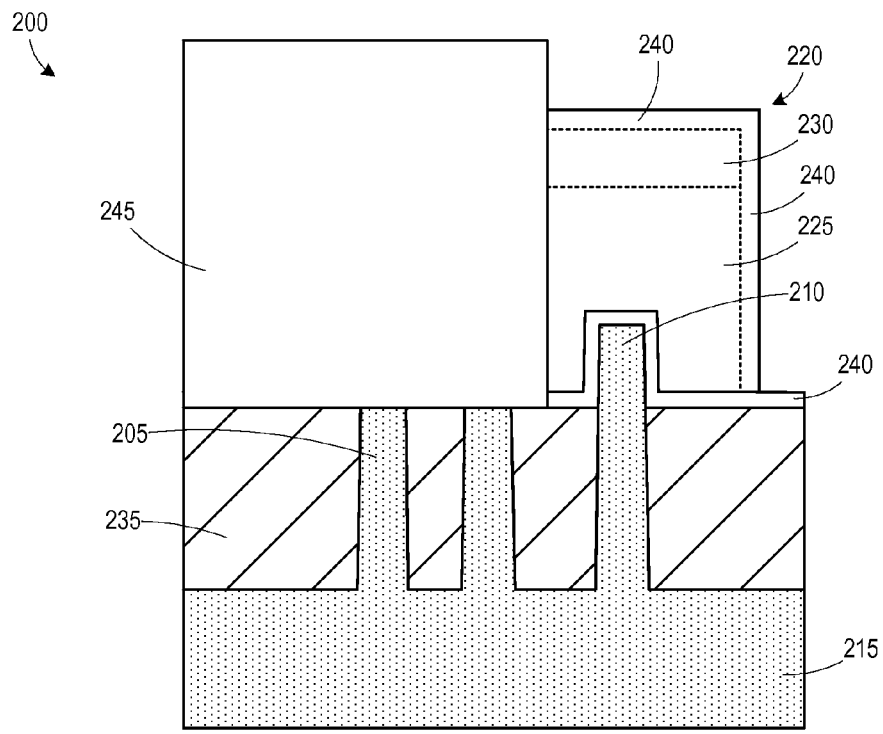
Figure 2D:
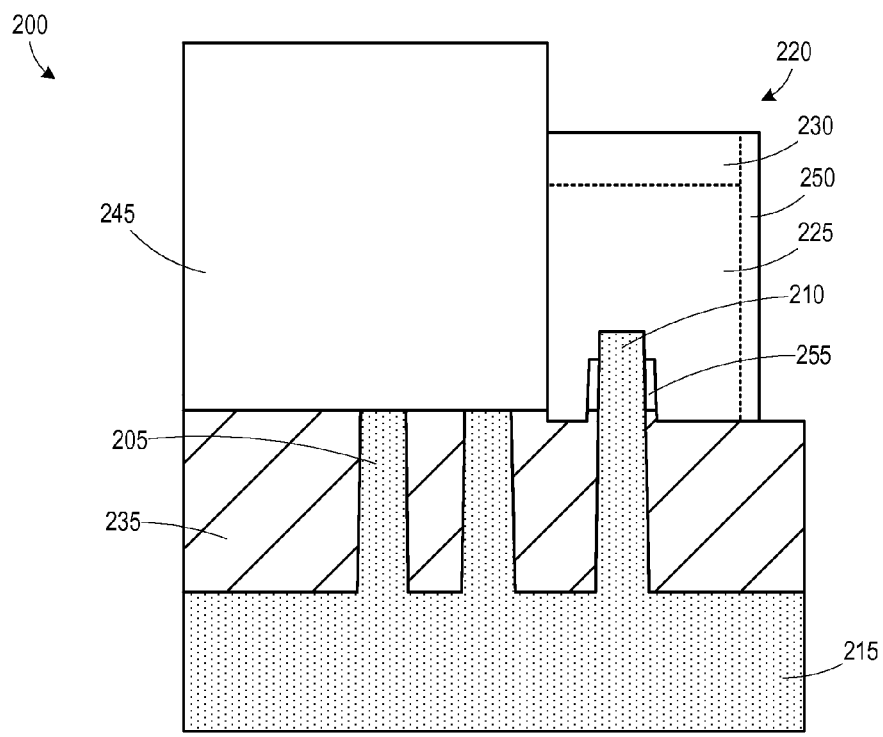
Figure 2E:
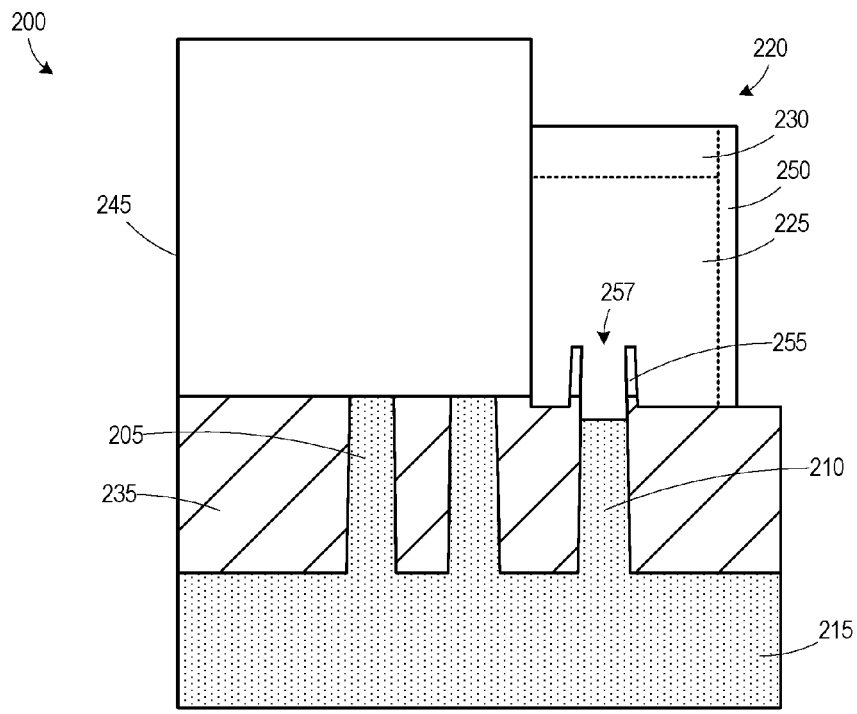
Figure 2F:
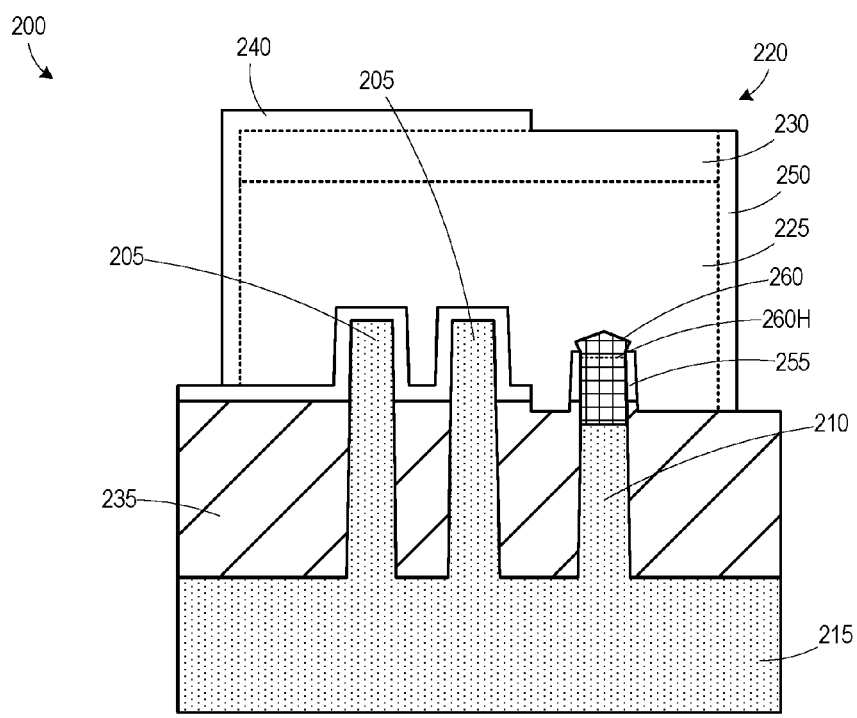
Figure 2G:
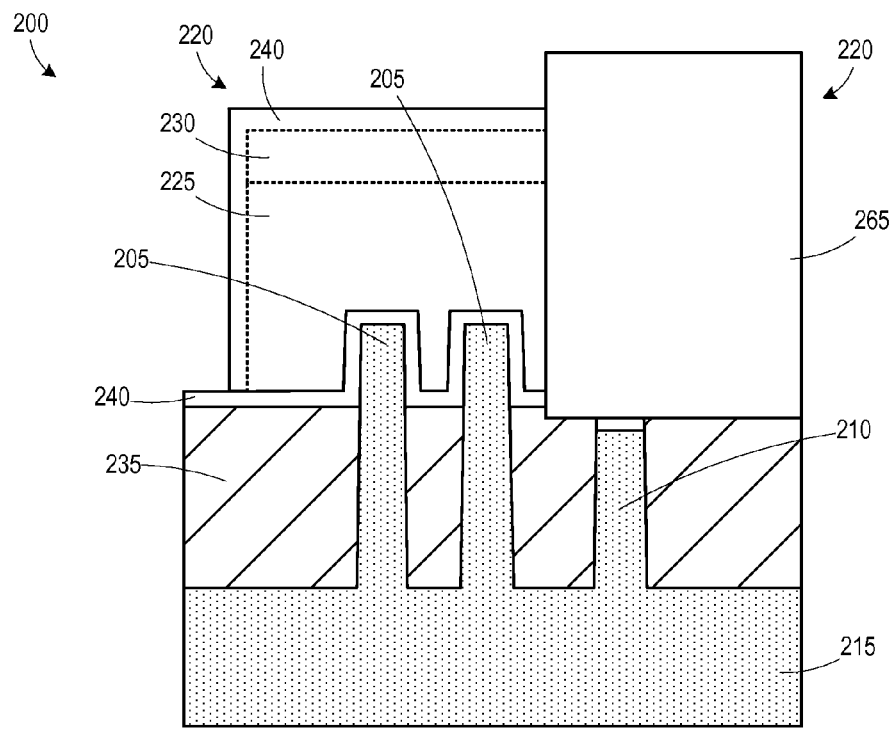
Figure 2H:
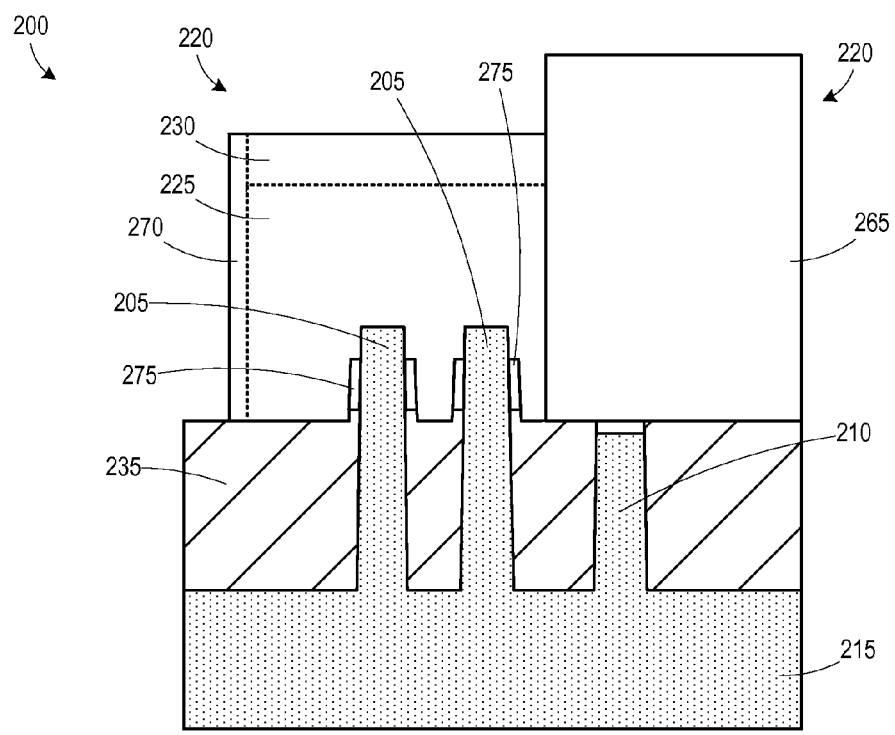
Figure 2I:
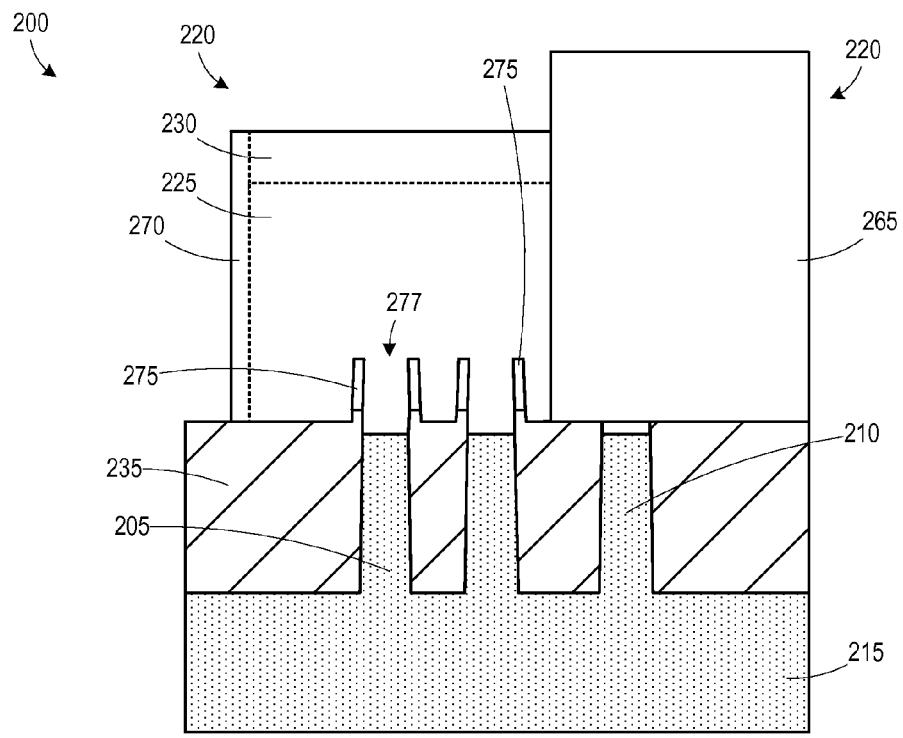
Figure 2J:
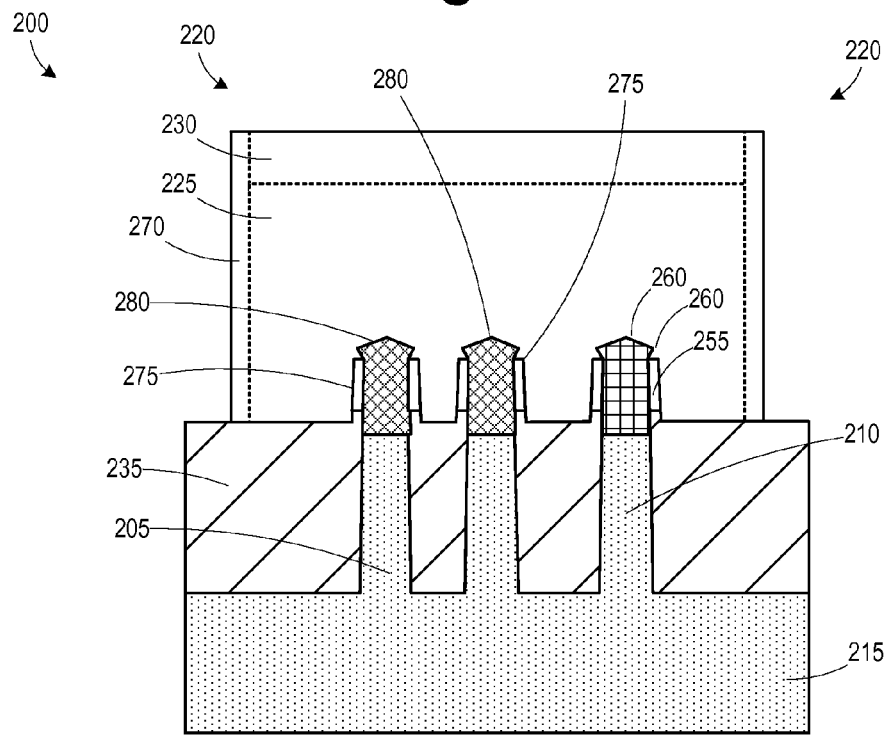
Figure 2K:
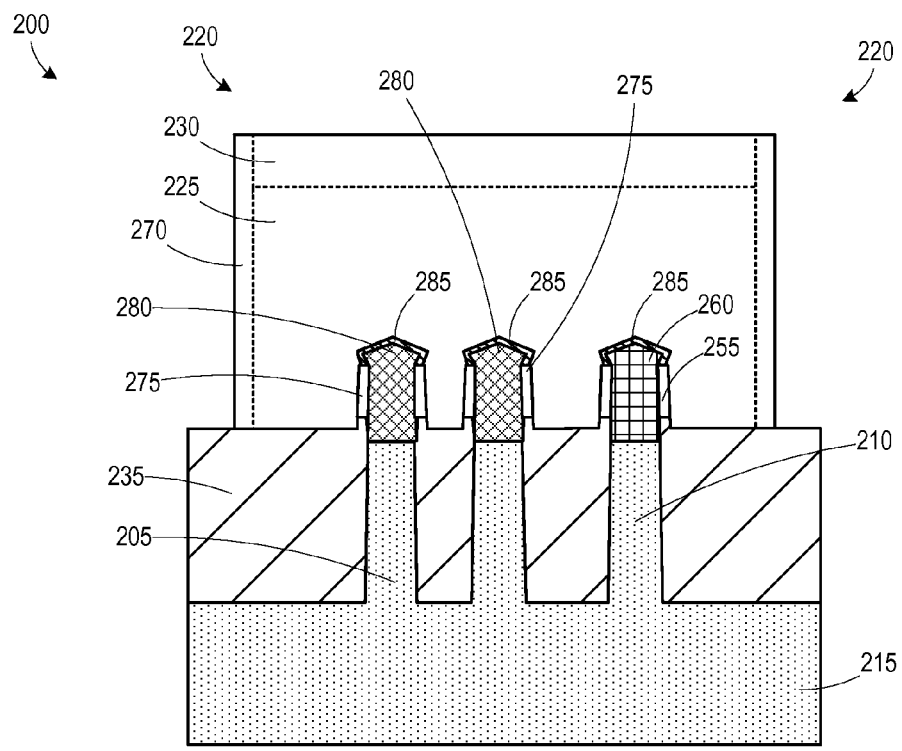
Figure 2L:
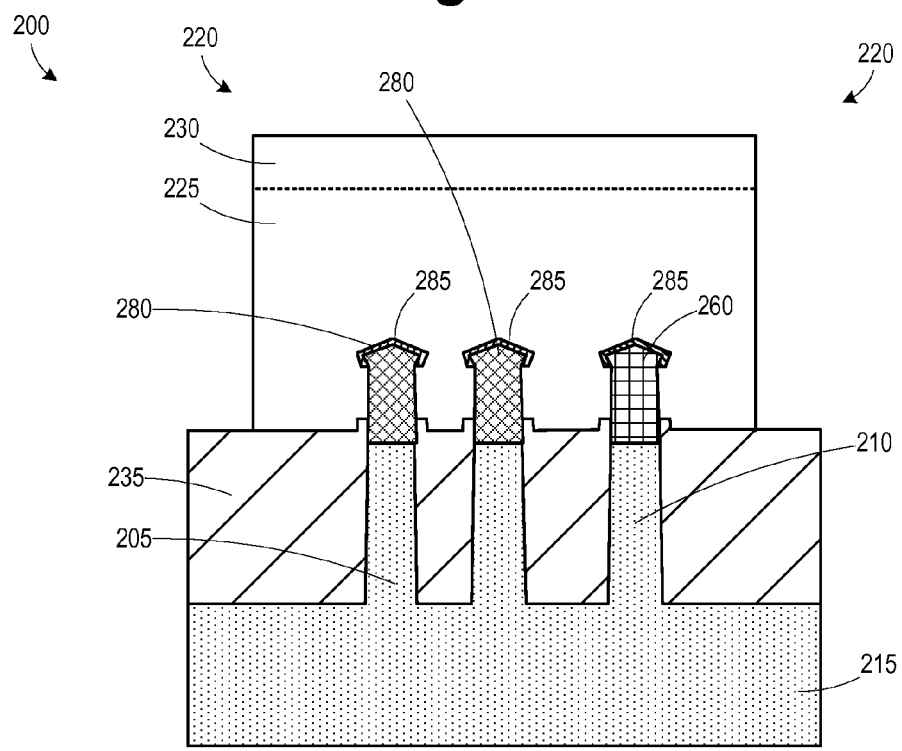
Figure 2M:
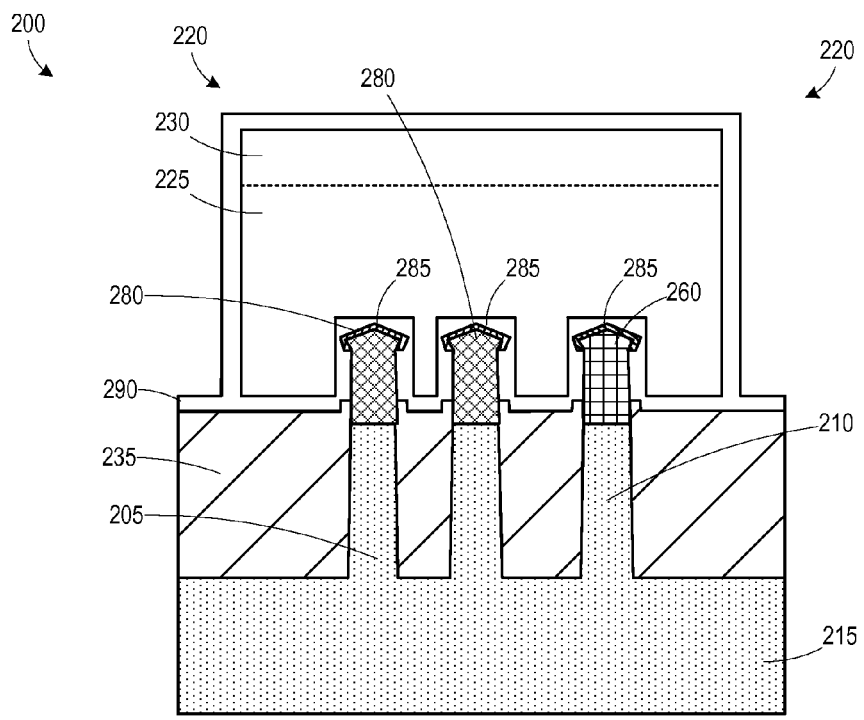
Figure 2N:
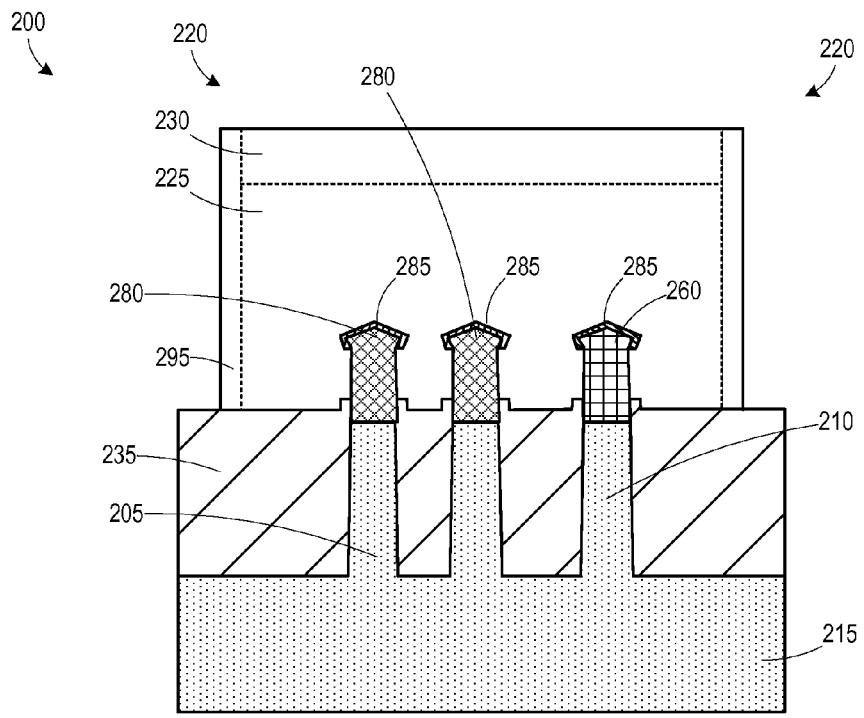
Figure 2O:
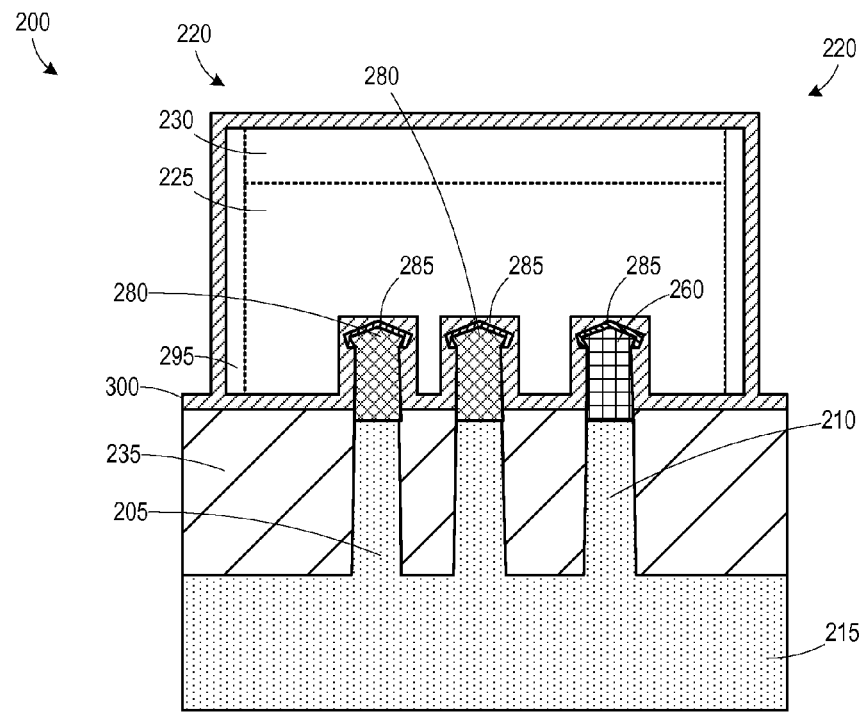
Figure 2P:
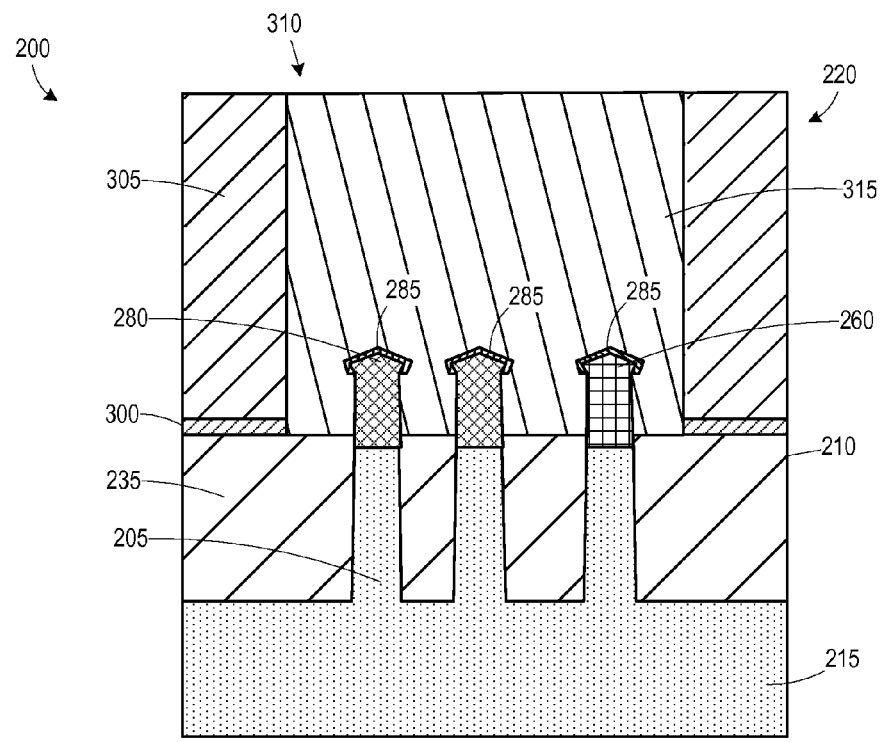

FIGS. 2A-2P illustrate various novel methods disclosed herein for forming an integrated circuit product 200. The product 200 includes fins 205 of an N-type transistor device and a fin 210 of a P-type transistor device defined in a substrate 215 and sharing a common placeholder gate electrode structure 220. The views in FIGS. 2A-2P are a combination of a cross-sectional view taken across the fins 205, 210 in the source/drain regions of the devices in a direction corresponding to the gate width direction of the devices, and a side view of the placeholder gate electrode structure 220 prior to the formation of any sidewall spacers. The number of fins 205, 210, and the spacing between fins may vary depending on the particular characteristics of the device(s) being formed. Various doped regions, e.g., halo implant regions, well regions and the like, may be formed, but are not depicted in the attached drawings. The substrate 215 may have a variety of configurations, such as the depicted bulk silicon configuration. The substrate 215 may also have a silicon-on-insulator (SOI) configuration that includes a bulk silicon layer, a buried insulation layer and an active layer, wherein semiconductor devices are formed in and above the active layer. The substrate 215 may be formed of silicon or silicon germanium or it may be made of materials other than silicon, such as germanium. Thus, the terms "substrate" or "semiconductor substrate" should be understood to cover all semiconducting materials and all forms of such materials. The substrate 215 may have different layers. For example, the fins 205, 210 may be formed in a process layer formed above the base layer of the substrate 215.

In one illustrative embodiment, a replacement gate technique is used to form the integrated circuit product 200, and the placeholder gate electrode structure 220 is illustrated prior to the formation of the replacement gate structure. The placeholder gate electrode structure 220 includes a sacrificial placeholder material 225, such as polysilicon, and a gate insulation layer (not separately shown), such as silicon dioxide. Also depicted is an illustrative gate cap layer 230 (e.g., silicon nitride). A recessed layer of insulating layer 235 (e.g., silicon dioxide) is formed between the fins 210, 215 to serve as an isolation structure. However, the application of the present subject matter is not limited to a replacement gate or "gate-last" technique, but rather, a gate-first technique may also be used, and the placeholder gate electrode structure 220 may be replaced with a functional gate electrode structure including a gate insulation layer and a conductive gate electrode.

FIG. 2B illustrates the integrated circuit product 200 after a deposition process was performed to form a spacer layer 240 (e.g., silicon nitride) above the placeholder gate electrode structure 220 and the fins 205, 210. The placeholder material 225 and the gate cap layer 230 are shown in phantom. The relative thicknesses of the gate cap layer 230 and the spacer layer 240 may vary depending on the particular embodiment.

FIG. 2C illustrates the integrated circuit product 200 after several processes were performed to deposit and pattern a mask 245 (e.g., photoresist) above the fins 205, i.e., to mask the fins 205 associated with the N-type transistor device.

FIG. 2D illustrates the integrated circuit product 200 after an anisotropic etch process was performed to etch the spacer layer 240 to form a sidewall spacer 250 on the placeholder material 225. The spacer etch process also recesses the insulating layer 235 and reduces the thickness of the cap layer 230. The spacer etch process is terminated prior to completely removing the spacer material 240 on the sidewalls of the fin 210, thereby leaving fin spacers 255 that partially cover the sidewalls of the fin 210.

FIG. 2E illustrates the integrated circuit product 200 after a timed selective etch process was performed to recess the fin 210 and define a fin recess 257.

FIG. 2F illustrates the integrated circuit product 200 after an epitaxial growth process was performed to form epitaxial material 260 on the exposed tip portions of the recessed fin 210 in the fin recess 257 and a strip process was performed to remove the mask 245. The fin spacers 255 constrain the lateral growth of the epitaxial material 260, limiting its lateral extension in the direction toward the other fins 205. In some embodiments, a dopant (e.g., a P-type dopant) may be introduced into the epitaxial material 260 while it is being formed. In some embodiments, a non-doping ion (e.g., Ge, Sn) having a covalent radius greater than silicon may also be introduced into the epitaxial material 260 to induce compressive strain on a channel region of the finFET device 200. As illustrated in FIG. 2F, there is some growth of the epitaxial material 260 above the spacers 255 in the lateral direction toward the adjacent fins 205, 210. The degree of desired lateral extension may be controlled based on the height of the fin spacers 255 or the processing time for the epitaxial growth process. The degree of lateral extension may be zero, if the epitaxial growth is controlled so that the epitaxial material 260 does not extend above the spacers 255, as indicated by phantom line 260H.

FIG. 2G illustrates the integrated circuit product 200 after several processes were performed to deposit and pattern a mask 265 (e.g., photoresist) above the fin 210, i.e., to mask the fin 210 associated with the P-type transistor device while leaving the N-type device exposed.

FIG. 2H illustrates the integrated circuit product 200 after an anisotropic etch process was performed on the spacer layer 240 to form a sidewall spacer 270 on the placeholder material 225. The spacer etch process recesses the insulating layer 235 and also reduces the thickness of the cap layer 230. The spacer etch process is terminated prior to completely removing the spacer material 240 on the sidewalls of the fins 205, thereby leaving fin spacers 275 that partially cover the sidewalls of the fins 205.

FIG. 2I illustrates the integrated circuit product 200 after a timed selective etch process was performed to recess the fins 205 and define fin recesses 277.

FIG. 2J illustrates the integrated circuit product 200 after an epitaxial growth process was performed to form epitaxial material 280 on the exposed tip portions of the recessed fins 205 in the fin recesses 277 and a strip process was performed to remove the mask 265. The fin spacers 275 constrain the lateral growth of the epitaxial material 280, limiting its lateral extension in the direction of each other and in the direction of the other fin 210 of the P-type device. As described above, the epitaxial material 280 may or may not extend beyond the fin recess 277, i.e., beyond the spacers 275. In some embodiments, a dopant (e.g., an N-type dopant) may be introduced into the epitaxial material 280 while it is being formed. In some embodiments, the epitaxial material 280 may be non-stress-inducing. In other embodiments, a non-doping ion having a covalent radius less than silicon (e.g., carbon) may also be introduced into the epitaxial material 280 to induce tensile strain on the channel region of the finFET device 200 below the placeholder gate electrode structure 220.

Due to the presence of the fin spacers 255, 275 during the epitaxial growth processes, the epitaxial material 260, 280 grown on the recessed fins 210, 205, respectively, does not merge across adjacent fins 205, 210 or between the fins 205, thereby preventing shorts between devices. Preventing merging between fins also provides a consistent fin height across regions of different fin density.

FIG. 2K illustrates the integrated circuit product 200 after one or more processes were performed to form a conductive cap layer 285 (e.g., a metal silicide) on the epitaxial material 260, 280. In one embodiment, a thin metal layer (e.g., titanium) may be blanket deposited, a heating process (e.g., rapid thermal anneal) may be performed to react the metal with silicon in the epitaxial material 260, 280 to define the conductive cap layer 285, and a strip process may be performed to remove unreacted portions of the metal layer. In an alternative embodiment, a selective metal deposition process may be used to form the conductive cap layer 285 (e.g., tungsten silicide).

FIG. 2L illustrates the integrated circuit product 200 after an etch process was performed to remove the spacers 255, 275 from the sidewalls of the epitaxial material 260, 280, respectively. The conductive cap layer 285 protects the epitaxial material 260, 280 from erosion during the etch process. In the illustrated embodiments, the etch process also removes the sidewall spacers 250, 270 from the placeholder gate electrode structure 220.

FIG. 2M illustrates the integrated circuit product 200 after a deposition process was performed to form another spacer layer 290 above the epitaxial material 260, 280 and the placeholder gate electrode structure 220. The spacer layer 290 may have a lower dielectric constant than the spacer layer 240 (shown in FIG. 2B) to reduce the capacitance of the device 200. For example, a low-k dielectric such as SiOC may be used in the spacer layer 290 in place of silicon nitride in the spacer layer 240.

FIG. 2N illustrates the integrated circuit product 200 after an anisotropic etch process was performed to etch the spacer layer 290 to form a sidewall spacer 295 on the placeholder material 225. The etch process is terminated after removing the spacer layer 290 on the sidewalls of the epitaxial material 260, 280. The conductive cap layer 285 protects the epitaxial material 260, 280 from erosion during the etch process. The etching process is performed for a sufficient duration such that the epitaxial materials 260, 280 and the conductive cap layers 285 are substantially free of the material of the spacer layer 290.

FIG. 2O illustrates the integrated circuit product 200 after a deposition process was performed to form a contact etch stop layer 300 (e.g., silicon nitride) above the placeholder gate electrode structure 220. In some embodiments, the contact etch stop layer 300 may be a stress-inducing layer.

FIG. 2P illustrates the integrated circuit product 200 after a plurality of processes were performed on the integrated circuit product 200. An etch process was performed to remove the sacrificial placeholder material 225. One or more deposition processes were performed to form a gate dielectric layer (not shown) and a metal gate electrode (not shown) (i.e., a replacement gate). A deposition process was performed to form an interlayer dielectric (ILD) layer 305, and an etch process was performed to define a contact opening 310 in the ILD layer 305 using the contact etch stop layer 300 to protect the epitaxial material 260, 280. An etch process was performed to remove portions of the contact etch stop layer 300 exposed by the contact opening 310. A deposition process was performed to form a conductive contact structure 315 (e.g., a trench silicide structure) in the contact opening 310 and a planarization process was performed to remove conductive material extending above the contact opening 310. The conductive contact structure 315 may include multiple layers, such as one or more barrier layers (e.g., Ta, TaN, TiN, etc.) to prevent migration of any metal in the conductive contact structure into the dielectric layer 305, a metal seed layer (e.g., copper), a metal fill material (e.g., copper), a metal silicide material, etc. Due to the removal of the spacers 255, 275 from the sidewalls of the epitaxial material 260, 280, the conductive contact structure 315 wraps around substantially all of the epitaxial material 260, 280 and the conductive cap layer 285.

Other processes may be performed to complete fabrication of the finFET device 200. Subsequent metallization layers and interconnect lines and vias may be formed. Other layers of material may be present, but are not depicted in the attached drawings.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming at least one fin in a semiconductor substrate;
   forming a gate structure around a second portion of said at least one fin;
   forming a fin spacer on at least a first portion of said at least one fin after forming said gate structure, said fin spacer having an upper surface;
   recessing said at least one fin to thereby define a recessed fin with a recessed upper surface that it is at a level below said upper surface of said fin spacer;
   forming a first epitaxial material on said recessed fin after recessing said at least one fin, wherein a lateral extension of said first epitaxial material is constrained by said fin spacer;
   forming a cap layer on all exposed surfaces of said first epitaxial material not covered by said fin spacer after forming said first epitaxial material, said exposed surfaces including an upper surface and all sidewall surfaces of said first epitaxial material extending above said fin spacer; and
   removing said fin spacer, wherein said cap layer protects said first epitaxial material during the removal of said fin spacer and remains in place on said first epitaxial material after the removal of said fin spacer.

2. The method of claim 1, wherein said cap layer comprises a conductive material.

3. The method of claim 2, wherein said cap layer comprises a metal silicide.

4. The method of claim 1, further comprising:
   forming a first spacer material layer above said gate structure and said at least one fin; and
   etching said first spacer material layer to form said fin spacer and to form a first sidewall spacer on said gate structure.

5. The method of claim 4, further comprising:
   removing said first sidewall spacer after removing said fin spacer;
   forming a second spacer material layer above said gate structure and said at least one fin, wherein said second spacer material layer has a lower dielectric constant than said first spacer material layer; and
   etching said second spacer material layer to form a second sidewall spacer on said gate structure and to remove material from said second spacer material layer from said at least one fin, wherein said cap layer protects said first epitaxial material during the etching of said second spacer material layer.

6. The method of claim 1, further comprising:
   forming an interlayer dielectric layer above said gate structure and said at least one fin;
   forming a contact opening in said interlayer dielectric layer to expose at least a portion of said first epitaxial material; and
   forming a conductive material in said contact opening to contact said portion of said first epitaxial material.

7. The method of claim 6, further comprising:
   forming a contact etch stop layer over at least said first epitaxial material prior to forming said interlayer dielectric layer, wherein said contact opening exposes a portion of said contact etch stop layer over at least said first epitaxial material; and
   removing said portion of said contact etch stop layer, wherein said cap layer protects said first epitaxial material during the removing of said portion of said contact etch stop layer.

8. The method of claim 1, wherein forming said at least one fin comprises forming a plurality of fins, each of said plurality of fins having fin spacers, and forming said first epitaxial material comprises forming a discrete epitaxial material structure on each of said plurality of fins.

9. The method of claim 1, wherein said first epitaxial material comprises a strain-inducing material.

10. The method of claim 1, wherein said first epitaxial material has an upper surface at a level even with or below said upper surface of said fin spacer.

11. The method of claim 1, wherein said at least one fin comprises a first fin associated with a P-type transistor device, said cap layer comprises a first cap layer, and the method further comprises:
    forming a second fin associated with an N-type transistor device in said semiconductor substrate;
    forming a second fin spacer on at least a first portion of said second fin, said second fin spacer having a second upper surface;
    recessing said second fin to thereby define a recessed second fin with a second recessed upper surface that is at a level below said second upper surface of said second fin spacer;
    forming a second epitaxial material on said second recessed fin, wherein a lateral extension of said second epitaxial material is constrained by said second fin spacer;
    forming a second cap layer on said second epitaxial material; and removing said first and second fin spacers, wherein said first cap layer protects said first epitaxial material and said second cap layer protects said second epitaxial material during the removal of said first and second fin spacers.

12. The method of claim 11, wherein said first epitaxial material comprises a different material than said second epitaxial material.

13. The method of claim of claim 12, wherein said first epitaxial material is strain-inducing and said second epitaxial material is non-strain-inducing.

14. A method, comprising:
forming at least one fin in a semiconductor substrate;
forming a gate structure around a second portion of said at least one fin;
forming a first spacer material layer above said gate structure and said at least one fin;
etching said first spacer material layer to a fin spacer on at least a first portion of said at least one fin, said fin spacer having an upper surface, and to form a first sidewall spacer on said gate structure;
recessing said at least one fin to thereby define a recessed fin with a recessed upper surface that it is at a level below said upper surface of said fin spacer;
forming a first epitaxial material on said recessed fin, wherein a lateral extension of said first epitaxial material is constrained by said fin spacer;
forming a cap layer on said first epitaxial material;
removing said fin spacer, wherein said cap layer protects said first epitaxial material during the removal of said fin spacer;
removing said first sidewall spacer after removing said fin spacer;
forming a second spacer material layer above said gate structure and said at least one fin, wherein said second spacer material layer has a lower dielectric constant than said first spacer material layer; and
etching said second spacer material layer to form a second sidewall spacer on said gate structure and to remove material from said second spacer material layer from said at least one fin, wherein said cap layer protects said first epitaxial material during the etching of said second spacer material layer.

15. The method of claim 14, further comprising:
forming an interlayer dielectric layer above said gate structure and said at least one fin;
forming a contact opening in said interlayer dielectric layer to expose at least a portion of said first epitaxial material; and
forming a conductive material in said contact opening to contact said portion of said first epitaxial material.

16. The method of claim 15, further comprising:
forming a contact etch stop layer over at least said first epitaxial material prior to forming said interlayer dielectric layer, wherein said contact opening exposes a portion of said contact etch stop layer over at least said first epitaxial material; and
removing said portion of said contact etch stop layer, wherein said cap layer protects said first epitaxial material during the removing of said portion of said contact etch stop layer.

17. The method of claim 14, wherein said first epitaxial material has an upper surface at a level even with or below said upper surface of said fin spacer.

18. The method of claim 14, wherein said cap layer covers a top surface and at least a portion of a sidewall surface of said epitaxial material.

19. A method, comprising:
forming at least one fin in a semiconductor substrate;
forming a gate structure around a second portion of said at least one fin;
forming a fin spacer on at least a first portion of said at least one fin, said fin spacer having an upper surface;
recessing said at least one fin to thereby define a recessed fin with a recessed upper surface that it is at a level below said upper surface of said fin spacer;
forming a first epitaxial material on said recessed fin, wherein a lateral extension of said first epitaxial material is constrained by said fin spacer;
forming a cap layer on said first epitaxial material;
removing said fin spacer, wherein said cap layer protects said first epitaxial material during the removal of said fin spacer;
forming a contact etch stop layer over at least said first epitaxial material;
forming an interlayer dielectric layer above said gate structure and said at least one fin;
forming a contact opening in said interlayer dielectric layer, wherein said contact opening exposes a portion of said contact etch stop layer over at least said first epitaxial material;
removing said portion of said contact etch stop layer, wherein said cap layer protects said first epitaxial material during the removing of said portion of said contact etch stop layer; and
forming a conductive material in said contact opening to contact said portion of said first epitaxial material.

* * * * *